United States Patent [19]

Thom et al.

[11] Patent Number: 4,778,537
[45] Date of Patent: Oct. 18, 1988

[54] METHOD OF MAKING A THERMOCOUPLE AND SO-MADE THERMOCOUPLE

[75] Inventors: Manfred Thom, Bruchköbel; Wolfgang Kohl, Rodenbach, both of Fed. Rep. of Germany

[73] Assignee: W. C. Heraeus GmbH, Hanau, Fed. Rep. of Germany

[21] Appl. No.: 81,470

[22] Filed: Aug. 4, 1987

[30] Foreign Application Priority Data

Oct. 25, 1986 [DE] Fed. Rep. of Germany ....... 3636468

[51] Int. Cl.$^4$ .............................................. H01L 35/34
[52] U.S. Cl. ..................... 136/201; 136/232; 136/233; 136/242
[58] Field of Search ............... 136/201, 232, 233, 242

[56] References Cited

U.S. PATENT DOCUMENTS

| | | | |
|---|---|---|---|
| 4,175,438 | 11/1979 | Wenzl et al. | 136/233 X |
| 4,238,957 | 12/1980 | Bailey et al. | 136/232 X |
| 4,277,886 | 7/1981 | Bauer et al. | 136/233 X |
| 4,278,828 | 7/1981 | Brixy et al. | 136/232 |
| 4,477,687 | 10/1984 | Finney | 136/233 X |
| 4,724,428 | 2/1988 | Brown, Jr. | 136/232 X |

OTHER PUBLICATIONS

"Mantel-Thermoelemente"-VDI Betrichte Nr.112, 1966, p. 95.
"Elektrotechnik" 52, H. 4,18,02.70 pgs. 16 and 17.

Primary Examiner—Peter A. Nelson
Attorney, Agent, or Firm—Frishauf, Holtz, Goodman & Woodward

[57] ABSTRACT

To make a jacketed thermoelement, two metal wires, one of which is pure platinum, preferably of at least 99.9, and even higher purity, and the other being a platinum/rhodium alloy are included in a ceramic element. The wires are first threaded into capillary openings of a cylindrical ceramic element which is jacketed by a jacket of platinum-rhodium alloy or INCONEL (TM). The initial assembly is hammered, thereby crashing the ceramic, and drawn to reduce the outer diameter of the metal jacket tube to fit the inner diameter of an auxiliary tube, for example of a copper-tin alloy which is fitted over the metal jacket tube. The thus formed composite is then passed through a sequence of drawing dies, preferably in a single drawing pull, in which each die reduces the cross-section by about 9-10%, until the desired outer diameter of the metal jacket tube (4) is reached; this diameter may be in the order of 0.3 mm, after starting with an outer diameter of just under 5 mm. The two wires (2,3) should have approximately the same hardness, the metal jacket (2,4) should have at least 1.5 times the hardness of the wires, and the auxiliary tube, which is later-on etched away, should have a hardness approximately in the same order as that of the jacket tube (4). The composite assemblies preferably annealed, at over 700° C. after drawing through the respective drawing dies.

20 Claims, 1 Drawing Sheet

METHOD OF MAKING A THERMOCOUPLE AND SO-MADE THERMOCOUPLE

The present invention relates to jacketed wire thermoelements, and more particularly to a method of making such thermoelements.

BACKGROUND

Wire thermoelements, particularly miniaturized wire thermoelements are known. Two wires, for example a platinum wire and a platinum-rhodium alloy wire are introduced into a capillary opening of a ceramic body, which ceramic body-wire combination is then introduced into a metal tube. The structure is then worked, for example being subjected to drawing and/or forging steps.

The structures are tiny. For example, the wires may have a diameter of about 0.1 millimeter, and the structure, when finished, has an outer diameter of less than 1 mm and an axial length of, for example, about 5 cm.

Jacketed thermoelements usually are temperature sensors in which two wires, suitable to form a thermocouple are connected together at one end, for example by welding, and introduced into a ceramic body which separates the wires from each other throughout the length of the thermoelement and, additionally, separates the wires from a metal jacket. The ceramic structure, thus, provides for insulation of the wires—except at the welded thermal junction, as well as from the metal jacket.

To manufacture jacketed thermoelements, it is customary to start with a tubular element of ceramic, for example magnesium oxide. The ceramic tube has two capillary openings therein. The wires which are to form the thermocouple are threaded into the capillaries. Typical thermocouple combinations are platinum and a platinum-rhodium alloy; or nickel and a nickel-chromium alloy. For the Pt-PtRh combination, platinum of high purity, for example of about 99.99% is desirable. The ceramic tube is fitted into a tubular metal jacket, for example of a platinum-rhodium alloy, e.g., PtRh 10; another suitable material is Inconel (Reg. TM of the INCO COMPANY). The so constructed sub-assembly is then deformed, by mechanical working to the desired dimension. Typical working is by hammering, carried out uniformly from all the sides so that the geometry of the structure is retained, or by drawing.

The metallic structures of the sub-assembly can be plastically deformed; in contrast thereto, however, the ceramic tube cannot be deformed. The ceramic breaks upon the mechanical working and pulverizes to become a very fine grained powder, which tightly surrounds and embeds the wire elements. It is customary to use fine grain ceramic, with a theoretically possible density up to about 95%.

The effect of mechanical working is transferred from the jacket via the ceramic to the thermocouple wire elements. Stresses introduced into the jacket by the mechanical working and deformation thereof, as well as frictional strains due to engagement with a drawing die, are not directly applied to the thermocouple wire elements; rather, the thermocouple wires are stressed indirectly by transfer of stresses by the ceramic particles. The ceramic particles, themselves, cannot be plastically deformed or be subjected to metal flowing. The wires are not centrally located within the tubular structure; thus, tensions and stresses extending from the jacket up to the center of the core are different at different radial positions. This causes the wires to lose their geometry and to break. Breakage is particularly severe if thermoelements of extremely small size are to be made, for example thermoelements having a diameter which is less than 0.4 mm outer diameter, and especially less than 0.25 mm outer diameter.

Typical jacketed thermoelements are described in the referenced publication: VDI-Berichte Nr. 112, 1966, Seite 95 ff. (DK 536.532–213.3) unter der Überschrift "Mantel-Thermoelemente" von Ing. T. Sannes, Eindhoven (Niederl.), (Reports by the Society of German Engineers, No. 112 (1966) page 95 et. seq., article by Ing. T. Sannes, Eindhoven (Netherlands) entitled: "Jacketed Thermoelements"). This publication describes that thermoelements of only 0.34 mm outer diameter have been made to be used in nuclear technology, having a flat-rolled measuring end point. Such thermoelements did not use a platinum-platinum/rhodium 10 thermocouple, since thermal wires of the platinum-platinum/rhodium 10 combination are not suitable for use in nuclear reactor technology.

Other jacketed thermoelements are described in "elektrotechnik" 52, H. 4, 18, 02.70, Seiten 16 und 17 unter der e,uml/u/ berschift "Thermoelemente miniaturisisiert und gut bewehrt" (Electrotechnik, Issue 52, 18. Feb. 1970, pages 16, 17, article "Miniaturized Thermoelements, Well Proven"). This publication stresses that for small diameter, a trend to use thermal wires of chrome-alumel has been noticed, since this combination of materials has more desirable characteristics and can provide thermocouples of minimum dimension—outer dimensions to down to 0.25 mm. Diameters and dimensions for platinum, and platinum-rhodium thermocouples, as well as methods for the manufacture of the thermocouples are not disclosed; the platinum-platinum/rhodium combination is mentioned, but is not stated how they can be made.

THE INVENTION

It is an object to provide a method and a structure which permits manufacture of thermocouples having a platinum-platinum/rhodium thermocouple wire combination having an outer diameter which is in the order of about 0.3 mm.

Briefly, the thermocouple is placed within a metal jacket tube which retains therein a ceramic and two thermocouple wires, one of which is a platinum wire and the other one a platinum-rhodium wire. The wires are joined, as well known, to form a thermocouple junction. The ceramic material surrounds and embeds the metal wires and separates the metal wires from each other as well as from the jacket tube.

In accordance with the present invention, the thermocouple wires have at least approximately similar deformation strength characteristics; the metal jacket tube has at least 1.5 times the deformation strength characteristic of the metal wire. The sub-assembly of ceramic-thermocouple wires-metal tube is evacuated, while being heated up to about 400° C., the metal tube then being closed to retain the vacuum. An auxiliary tube is placed over the jacket tube. The auxiliary tube is of metal which has a deformation strength which is at least the same order of strength as that of the jacket tube, but may be higher, to form a composite intermediate assembly. The composite intermediate assembly is then cold worked, for example by hammering, drawing and the like until the desired outside diameter of the jacketed thermoelement is reached; and then the auxiliary tube is removed, for example by an etch solution.

The working may be in various substeps; preferably, a hammering step is used and then a single drawing step through a plurality of drawing dies, by cold deformation of the intermediate composite assembly.

DRAWINGS

FIG. 1 is a schematic cross-sectional view through a composite intermediate sub-assembly, showing the thermoelement with the auxiliary tube in place; and FIG. 2 is a schematic cross-sectional view showing the finished thermoelement after removal of the auxiliary jacket tube.

DETAILED DESCRIPTION

Figure 1:
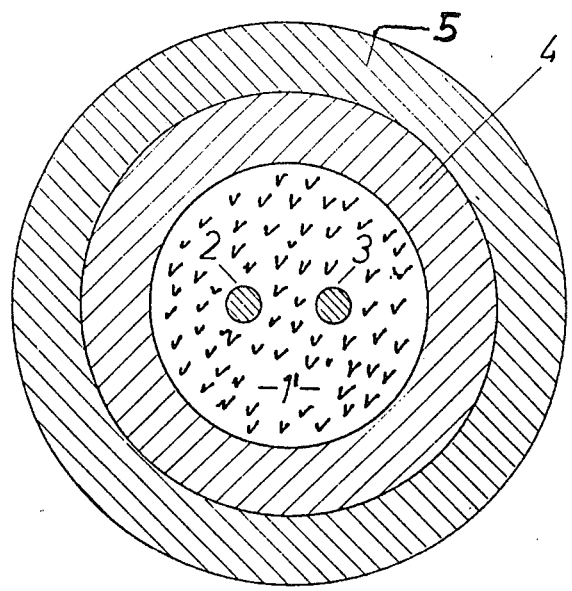
Figure 2:
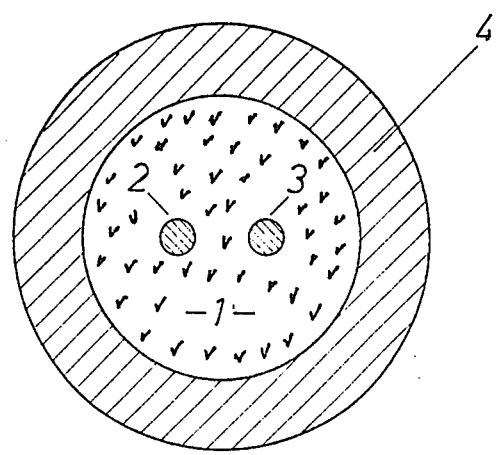

The finished thermoelement, see FIG. 2, has a core structure formed by ceramic material 1 in which a platinum wire 2 and the platinum-rhodium alloy wire 3 are embedded. The structure is surrounded by a metal jacket tube 4. To obtain this structure, and in the process of manufacture, a ceramic cylindrical element 1', formed with two axial openings therein, is provided, through which the platinum wire 2 and a platinum-rhodium 10 wire 3 are being threaded. The ceramic cylindrical element 1' is then inserted into the metal jacket 4. The metal jacket 4, preferably, is a platinum-rhodium 20 alloy. It is, then, surrounded by an outer auxiliary jacket or tube 5, for example made of CuSn6. After removal of the auxiliary jacket 5, the structure shown in FIG. 2 will again result.

The views are schematic and should not be considered as being drawn to scale.

It has been found that the process of the present invention results in thermoelements with extremely uniform cross-section of the thermal wire elements 2,3, embedded in the ceramic 1, or 1'. The outer diameter of the jacket 4 can be worked down to be of only about 0.3 mm; the diameter of the wires 2,3, after working, will be in the order of about 0.05 to 0.07 mm. Such thermoelements can be quite long.

It has been found that these thermoelements have an essentially uniform cross-sectional appearance throughout their axial length. Due to the essentially uniform geometry of the wires 2,3, no notches or similar disconformities arise which might cause breakage. The provision of the intermediate assembly with the auxiliary jacket 5 permits a high degree of uniformity upon working of the structure so that thermoelements can be made with minimum outer diameter.

In accordance with a preferred feature of the invention it has been found that after the jacket 5 has been removed, it is desirable to anneal the remaining structure, for example by heating to at least low incandescence, in order to relieve tensions and to obtain a structure which can be bent. Annealing temperatures of 700° C. and higher are suitable, preferably in the order of about 900° C.

The selection of materials for the specific wires, the metal jacket 4 and the auxiliary jacket 5 determines the final diameter which can be obtained after drawing of the composite sub-assembly. Wire 2, preferably, is a platinum wire of high purity, the higher purity the better; the platinum-rhodium wire 3 should, preferably, have between about 10 to 30%—by weight—of rhodium. The jacket 4 preferably is a platinum-rhodium alloy of between 10 to 30% of rhodium. INCONEL (Reg. TM) also has yielded good results.

Reduction of the external diameter from the initial dimensions is preferably obtained by a plurality of drawing steps. The last drawing step preferably reduces the outer diameter of the jacket 4 to at least 0.25 mm. Particularly good results with respect to uniformity of the wires was obtained when the original outer diameter of the wire 4 was in the order of about 5 mm. A jacket 4 of about 5 mm diameter then has the ceramic cylindrical element 1' introduced therein, into which the wires 2,3, in turn, are threaded. Preferably, the individual dies through which the composite is drawn provides for reduction in cross-section by about 10% for each drawing die.

EXAMPLES

EXAMPLE 1

Platinum-platinum/rhodium 10 jacketed thermoelement with a platinum/rhodium 20 jacket.

Starting materials: ceramic core cylindrical structure of MgO, porous, with two capillary axial ducts. Outer diameter (OD) 3.5 mm. Diameter of capillary ducts 0.7 mm. Axial length: 50 mm.

Wire 2: platinum, wire diameter 0.6 mm, hard drawn with a hardness of 130 HV (hardness: Vicker scale).

Wire 3: platinum/rhodium 10; diameter 0.6 mm, slightly shaped—degree of shaping 10%. Hardness 160 HV.

Jacket 4: platinum/rhodium 20 metal tube, external diameter 4.6 mm, internal diameter 3.6 mm, hard drawn to 99%, hardness 240 HV.

Auxiliary jacket 5: copper-tin 6 (CuSn6), 30% worked, hardness 200 HV. External diameter 6 mm; internal diameter 4 mm.

Process of Manufacture: The wires 2,3 are threaded into the ceramic cylinder, and the ceramic cylinder, with the wires therein, are threaded within the PtRh20 jacket 4. In a first drawing step, the assembly is drawn to an external diameter of 4.49 mm. Thereafter, by round hammering the external diameter is reduced to 4.08 mm. The hammered unit is then drawn in a single drawing step to 3.89 mm external diameter.

The so reduced sub-assembly is then introduced into the auxiliary jacket which has an initially slightly larger internal diameter of 4 mm. The external diameter of the auxiliary jacket is 6 mm. The so formed composite intermediate assembly is than drawn to an external diameter of 5.54 mm in a single draw Pull. The drawn-down composite intermediate assembly is when further drawn through additional drawing dies, preferably in a single continuous drawing pull, with a reduction between dies by 9%.

The drawings through the sequantial dies is continued in a single draw pull until the PtRh20 jacket 4 has the desired outer diameter, for example in the order of about 0.3 mm. The auxiliary jacket 5 is removed by etching or pickling, resulting in the structure shown in FIG. 2, with the appropriate outer diameter of the jacket 4. Thereafter, the composite unit having as the outer cover only the jackat 4 is annealed, for example by heating to at least low incandescence.

EXAMPLE 2

Platinum-platinum/rhodium 10 jacketed thermoelement having an INCONEL (TM) jacket: The starting materials, dimensions, and process steps are all identical to the Example 1, with this exception: the jacket 4 is formed by an INCONEL metal jacket of outer diamater 4.6 mm and inner diameter of 3.6 mm, with a hardness of 270 HV, rather thau using a Pt-Rh20 jacket.

The present invention permits construction of very fine thermal elements having a Pt-Pt/Rh combination. The material combination Platinum-platinum/rhodium 10 is difficult to handle sinc the material characteristics of rhodium differ substantially from th of platinum. Other material combinations such as Ni-Ni/Cu in which the materials have characteristics which are compatible can be drawn to fine wires in accordance with prior art technologies. This is not the case, however, with the Pt-Pt/Rh combination unless heating-to-incandescence steps are used. These heating steps are here eliminated.

Various changes may be made within the scope of the present invention.

We claim:

1. Method of making a thermoelement,
   wherein said thermoelement includes
   a metal jacket tube (4);
   at least two metal wires (2,3), a first one of said wires comprising platinum and a second one of said wires comprising a platinum-rhodium alloy,
   said wires being located within said metal tube; and
   a ceramic material (1) located within said metal tube, surrounding and embedding said metal wires and separating the metal wires from each other and from the tube,
   comprising, in accordance with the invention, the steps of
   providing said metal wires (2,3) with at least approximately similar deformation strength characteristics;
   providing said metal jacket tube (4) with at least 1.5 times the deformation strength characteristics as that of the metal wires;
   evacuating the metal tube, with the wires and ceramic material therein, while heating said metal tube up to about 400° C.;
   closing the metal tube;
   fitting an auxiliary tube (5) over said jacket tube (4), said auxiliary metal tube having a deformation strength which is of the same order ff the deformation strength as that of the jacket tube (4), to form a composite intermediate assembly;
   cold working the composite intermediate assembly to reduce the diametrical dimension of said assembly to a predetermined diametrical dimension of said metal jacket tube (4); and
   then removing the auxiliary tube (5).

2. The method of claim 1, wherein said step of cold working the composite intermediate assembly comprises drawing said intermediate assembly through a plurality of drawing dies.

3. The method of claim 2, wherein said drawing step comprises drawing said intermediate assembly through said dies in a single drawing pull.

4. The method of claim 2, wherein said drawing step comprises reducing the cross-section of said composite intermediate assembly by not over approximately 10% for each drawing die.

5. The method of claim 4, wherein said reduction is about 9% for each drawing die.

6. The method of claim 1, further including the step of annealing the cold worked intermediate assembly after removal of the auxiliary tube.

7. The method of claim 2, further including the step of annealing the cold worked intermediate assembly after removal of the auxiliary tube.

8. The method of claim 6, wherein said annealing step comprises annealing at a temperature in excess of about 700° C.

9. The method of claim 1, wherein the platinum-rhodium alloy wire (3) has between about 10 to 30% of rhodium—by weight.

10. The method of claim 9, wherein the metal jacket tube (4) comprises a platinum-rhodium alloy, having between about 10 to 30% rhodium, by weight.

11. The method of claim 1, wherein the metal jacket tube (4) comprises a platinum-rhodium alloy, having between about 10 to 30% rhodium by weight.

12. The method of claim 1, wherein the metal jacket tube (4) comprises INCONEL.

13. The method of claim 1, wherein said step of cold working the composite intermediate assembly comprises drawing the composite intermediate assembly to have a final outer diameter of at least 0.25 mm.

14. The method of claim 1, wherein the outer diameter of the metal jacket tube as a starting material is about 5 mm.

15. The method of claim 2, wherein the outer diameter of the metal jacket tube as a starting material is about 5 mm.

16. The method of claim 1, including the step of preliminarily working said evacuated, heated and closed metal tube in advance of fitting said auxiliary metal tube (5) thereover to reduce the outer diameter of said metal jacket tube (4) to fit the internal diameter of said auxiliary tube.

17. The method of claim 16, wherein said preliminary working step includes hammering and drawing.

18. Composite intermediate assembly for manufacture of a jacketed thermoelement comprising
   a metal jacket tube (4);
   a ceramic material (1) located within said jacket tube (4);
   a first platinum wire (2) located in, and embedded in said ceramic material;
   a second wire of platinum-rhodium alloy, located in said metal tube, and surrounded and embedded by said ceramic material,
   said ceramic material separating said wires from each other and from the jacket tube;
   wherein said metal wires (2,3) have at least approximately the same deformation strength characteristics;
   said metal jacket tube (4) has at least 1.5 times the deformation strength characteristics as the metal wires; and
   further including an auxiliary tube (5) tightly surrounding said jacket tube and having a deformation strength which is in the same order as the deformation strength of said jacket tube (4).

19. The intermediate composite element of claim 18, wherein said deformation strength characteristics comprises metal hardness.

20. The method of claim 1, wherein said deformation strength characteristics comprises metal hardness.

* * * * *